United States Patent
Yugawa

(10) Patent No.: US 12,446,154 B2
(45) Date of Patent: Oct. 14, 2025

(54) WIRING BOARD

(71) Applicant: KYOCERA Corporation, Kyoto (JP)

(72) Inventor: Hidetoshi Yugawa, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 106 days.

(21) Appl. No.: 18/028,951

(22) PCT Filed: Sep. 14, 2021

(86) PCT No.: PCT/JP2021/033701
§ 371 (c)(1),
(2) Date: Mar. 28, 2023

(87) PCT Pub. No.: WO2022/065134
PCT Pub. Date: Mar. 31, 2022

(65) Prior Publication Data
US 2023/0337361 A1 Oct. 19, 2023

(30) Foreign Application Priority Data
Sep. 28, 2020 (JP) .................. 2020-161907

(51) Int. Cl.
*H05K 1/11* (2006.01)
(52) U.S. Cl.
CPC ..... *H05K 1/116* (2013.01); *H05K 2201/0209* (2013.01); *H05K 2201/096* (2013.01)
(58) Field of Classification Search
CPC ............ H05K 1/0271; H05K 1/116; H05K 2201/0195; H05K 2201/0209; H05K 2201/0338; H05K 2201/068; H05K 2201/09581; H05K 2201/096; H05K 3/4688

USPC ........................................... 174/255
See application file for complete search history.

(56) References Cited

U.S. PATENT DOCUMENTS

| | | | |
|---|---|---|---|
| 10,051,734 B2* | 8/2018 | Kitagawa ............. | H05K 3/4015 |
| 2007/0017698 A1* | 1/2007 | Ueno .................... | H05K 3/421 |
| | | | 174/262 |
| 2014/0353025 A1* | 12/2014 | Jang ...................... | H05K 3/421 |
| | | | 29/829 |
| 2015/0305153 A1 | 10/2015 | Imafuji et al. | |
| 2019/0006283 A1* | 1/2019 | Wang .................. | H01L 23/5386 |
| 2022/0077046 A1* | 3/2022 | Adachi ................ | H05K 1/0298 |

FOREIGN PATENT DOCUMENTS

JP    2003046244 A    2/2003
JP    2015-216344 A    12/2015

* cited by examiner

*Primary Examiner* — Timothy J Thompson
*Assistant Examiner* — Sidi M Maiga
(74) *Attorney, Agent, or Firm* — Volpe Koenig

(57) ABSTRACT

A wiring board according to the present disclosure includes a first insulation layer including a first surface, a land located on the first insulation layer and including a second surface, a second insulation layer located at the first surface of the first insulation layer and including a via hole extending over the second surface of the land, and a via-hole electrical conductor located in the via hole. The land includes a plurality of recessed portions on the second surface, and at least one recessed portion selected from the plurality of recessed portions includes a buffer body containing resin. The via-hole electrical conductor is in contact with the second surface of the land and the buffer body.

8 Claims, 3 Drawing Sheets

WIRING BOARD

TECHNICAL FIELD

The present invention relates to a wiring board.

BACKGROUND OF INVENTION

A wiring board includes a plurality of insulation layers and wiring conductor layers formed on the surface of the insulation layers, as illustrated in Patent Document 1, for example. The insulation layers include via-hole electrical conductors, and via the via-hole electrical conductors, electrical connection between wiring conductor layers located in the different insulation layers, that is, electrical connection in the thickness direction of the wiring board is performed.

Each of the via-hole electrical conductors is usually connected to a land formed on a different insulation layer. For example, at a contact surface between the via-hole electrical conductor and the land, when there is a relatively large difference between the linear expansion coefficient and the Young's modulus of a conductor included in the via-hole electrical conductor and the linear expansion coefficient and the Young's modulus of a conductor included in the land, stress may be generated at the time of thermal expansion and contraction, and the connection reliability between the via-hole electrical conductor and the land may be reduced. For example, at a contact surface between the via-hole electrical conductor and the land, when one is made of copper and the other is made of a metal other than copper (for example, nichrome (NiCr) or the like), the connection reliability between the via-hole electrical conductor and the land is likely to be reduced.

CITATION LIST

Patent Literature

Patent Document 1: JP 2015-216344 A

SUMMARY

Solution to Problem

A wiring board according to the present disclosure includes a first insulation layer including a first surface, a land located on the first insulation layer and including a second surface, a second insulation layer located at the first surface of the first insulation layer and including a via hole extending over the second surface of the land, and a via-hole electrical conductor located in the via hole. The land includes a plurality of recessed portions on the second surface, and at least one recessed portion selected from the plurality of recessed portions includes a buffer body containing resin. The via-hole electrical conductor is in contact with the second surface of the land and the buffer body.

DESCRIPTION OF EMBODIMENTS

As described above, in a known wiring board, at the contact surface between the via-hole electrical conductor and the land, when one is made of copper and the other is made of a metal other than copper (for example, nichrome (NiCr) or the like), the connection reliability between the via-hole electrical conductor and the land is likely to be reduced. There is thus a need for a wiring board with improved connection reliability between the via-hole electrical conductor and the land without affecting the electrical reliability between the via-hole electrical conductor and the land.

In a wiring board according to the embodiment of the present disclosure, the land includes a plurality of recessed portions on a surface of the land, and a buffer body containing resin is located in each of the recessed portions. Thus according to the present disclosure, a wiring board with improved connection reliability between the via-hole electrical conductor and the land without affecting the electrical reliability between the via-hole electrical conductor and the land can be provided.

Figure 1:
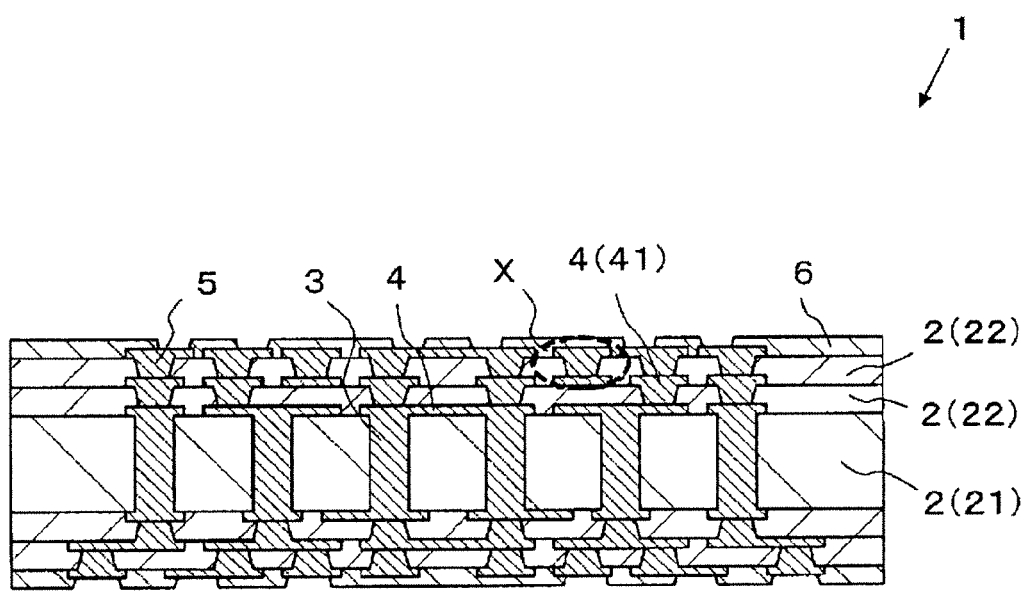
FIG. 1 is a schematic view illustrating a wiring board according to one embodiment of the present disclosure.

A wiring board according to one embodiment of the present disclosure will be described with reference to FIGS. 1 and 2. FIG. 1 is a schematic view illustrating a wiring board 1 according to one embodiment of the present disclosure.

The wiring board 1 according to one embodiment includes a plurality of insulation layers 2 and a wiring conductor layer 4 located on a surface of each of the plurality of insulation layers 2. The wiring conductor layer 4 includes a land 41.

Figure 2A:
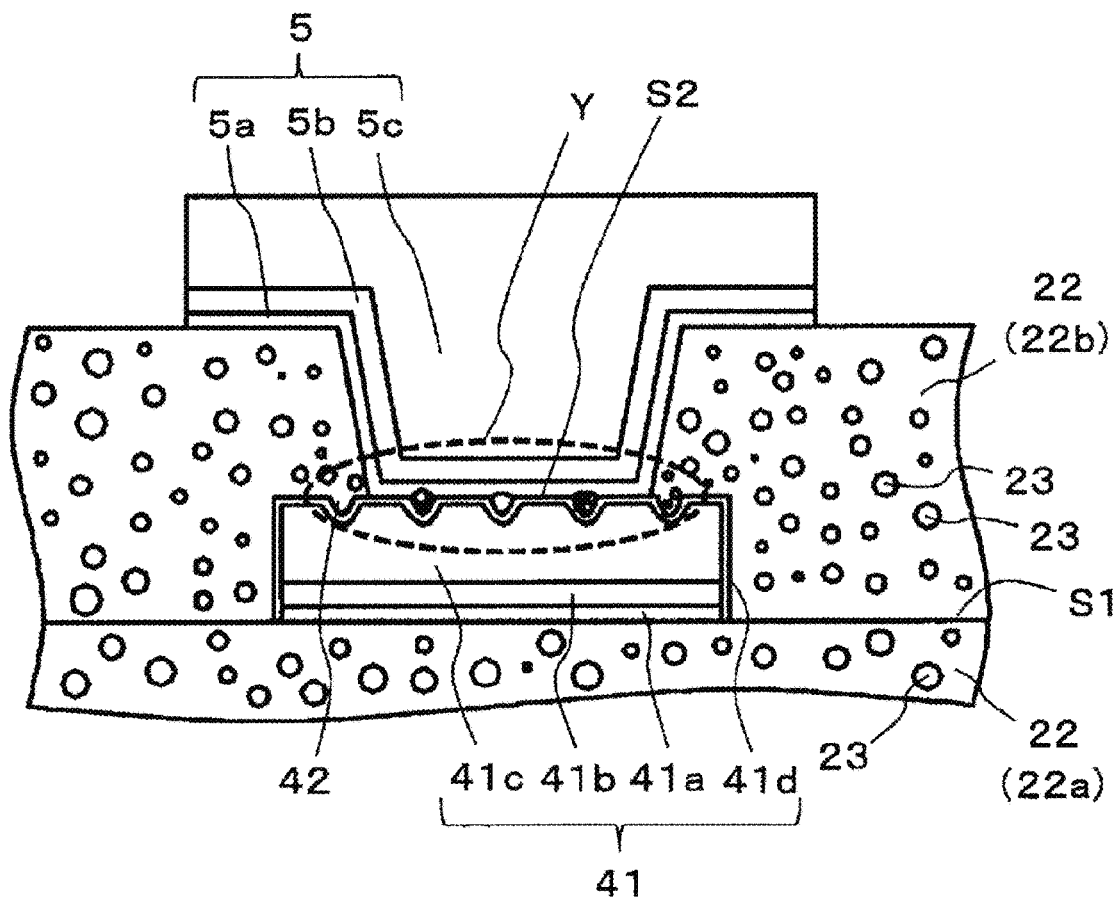
FIG. 2A is an enlarged explanatory view for illustrating a region X in FIG. 1

The insulation layers 2 are not particularly limited as long as they are made out of a material having an insulating property. Examples of the material having an insulating property include resins such as epoxy resin, bismaleimide-triazine resin, polyimide resin, polyphenylene ether resin, and liquid crystal polymer. These resins may be used alone or in a combination of two or more. As illustrated in FIG. 2A, insulating particles 23 may be dispersed in the insulation layers 2. Examples of the insulating particles 23 are not limited, and include inorganic insulating fillers such as silica, alumina, barium sulfate, talc, clay, glass, calcium carbonate, and titanium oxide.

In the wiring board 1 according to the embodiment, one of the plurality of insulation layers 2 is a core layer 21 and the remaining insulation layers 2 are build-up layers 22. The core layer 21 has a thickness of, for example, from 0.04 mm to 3.0 mm.

The core layer 21 includes a through-hole conductor 3 for electrically connecting the wiring conductor layers 4 on the upper and lower surfaces of the core layer 21 to each other. The through-hole conductor 3 is located in through holes penetrating the upper and lower surfaces of the core layer 21. The through-hole conductor 3 is made of a conductor made of metal plating such as copper plating, for example. The through-hole conductor 3 is connected to the wiring conductor layers 4 on both surfaces of the core layer 21. The through-hole conductor 3 may be formed only on an inner wall surface of the through hole or the through hole may be filled with the through-hole conductor 3.

The build-up layers 22 have a thickness from 5 μm to 100 μm, for example. The build-up layers 22 may be formed of the same resin or different resins. The above-described insulation layer 2 includes a first surface S1 on which the land 41 is located.

The wiring conductor layer 4 is located on the surface of the insulation layer 2, that is, on the surface of the core layer 21 and on the surface of the build-up layers 22. The wiring conductor layer 4 is formed of a conductor such as copper, for example, copper foil or copper plating. The thickness of the wiring conductor layer 4 is not particularly limited and is, for example, from 2 μm to 50 μm. In a case where there are a plurality of the wiring conductor layers 4, the wiring conductor layers 4 may be composed of the same conductor, or may be composed of different conductors. Some of the wiring conductor layers 4 are used as the land 41 for connecting a via-hole electrical conductor 5, which will be described later. The lands 41 such as those described above include a second surface S2 excluding a portion in contact with the first surface S1 of the insulation layer 2.

Each of the build-up layers 22 includes the via-hole electrical conductor 5 for electrically connecting the wiring conductor layers 4 located above and below via the build-up layer 22 to each other. The via-hole electrical conductor 5 is obtained by depositing, for example, copper plating, in a via hole penetrating the upper and lower surfaces of the build-up layer 22. The via hole penetrating the upper and lower surfaces of the build-up layer 22 has, for example, an inner diameter from 2 μm to 100 μm at the bottom, and is formed through, for example, a laser machining process such as one using $CO_2$ laser, UV-YAG laser, or excimer laser. The via-hole electrical conductor 5 may be positioned to fill the via hole, or the via-hole electrical conductor 5 may be adhered to the inside surface of the via hole which is then filled with resin in portions where the via-hole electrical conductor 5 is not provided.

FIG. 2A is an enlarged explanatory view for illustrating a region X in FIG. 1. As illustrated in FIG. 2A, the land 41 is located on the surface (first surface S1) of a first insulation layer 22a. In the present specification, the terms "first insulation layer" and "second insulation layer" described later merely define one insulation layer as the "first insulation layer" and the other insulation layer as the "second insulation layer" for convenience, and are not limited to a layered structure in which two insulation layers are layered.

To be specific, regardless of the number of insulation layers layered, in any two insulation layers in which the land and the via-hole electrical conductors are in contact with each other, an insulation layer in which the land is located on the surface (first surface S1) of the insulation layer is defined as the "first insulation layer", and an insulation layer including the via-hole electrical conductor in contact with the land is defined as the "second insulation layer". Thus, when a land is formed on the surface of the insulation layer including the via-hole electrical conductor and an insulation layer including the via-hole electrical conductor in contact with the land is further layered, the former insulation layer is defined as the "first insulation layer" and the latter insulation layer is defined as the "second insulation layer".

The land 41 located on the surface (first surface S1) of the first insulation layer 22a is formed of a first metal layer 41a, a second metal layer 41b, a third metal layer 41c, and a fourth metal layer 41d. The first metal layer 41a is formed of, for example, nichrome (NiCr) and has a thickness from 1 nm to 100 nm. The second metal layer 41b is formed so as to cover the surface of the first metal layer 41a. The second metal layer 41b is formed of, for example, copper and has a thickness from 100 nm to 1000 nm. The third metal layer 41c is formed so as to cover a surface of the second metal layer 41b. The third metal layer 41c is formed of, for example, copper and has a thickness from 1 μm to 60 μm.

The fourth metal layer 41d is formed so as to cover a surface of the third metal layer 41c, a side surface of the first metal layer 41a, a side surface of the second metal layer 41b, and a side surface of the third metal layer 41c. The fourth metal layer 41d is formed of, for example, a conductor containing tin and has a thickness from 0.1 nm to 10 nm. The upper surface and a part of the side surfaces of the fourth metal layer 41d contain an alloy with copper. When the fourth metal layer 41d is formed of the alloy of tin and copper, because tin has excellent compatibility with a silane coupling agent described later, the adhesiveness between the land 41 and the second insulation layer 22b can be further improved.

Figure 2B:
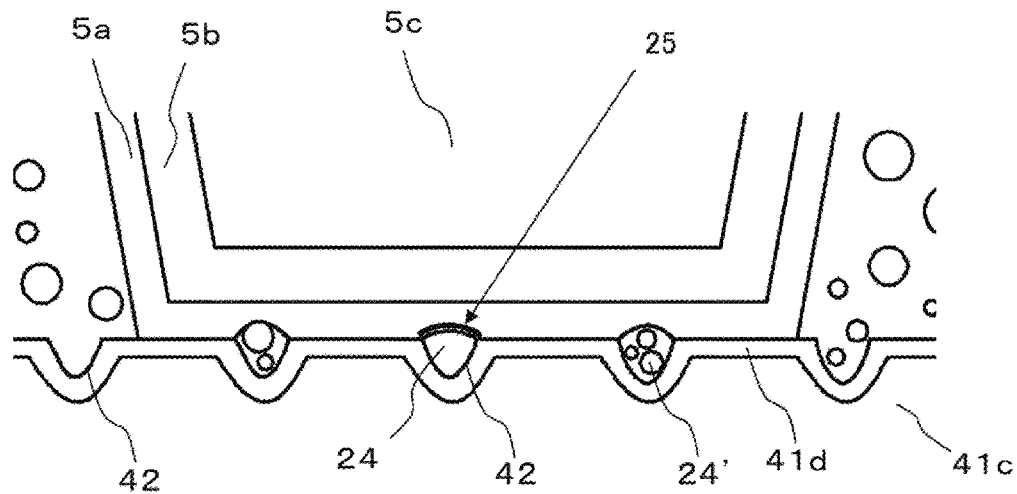
FIG. 2B is an enlarged explanatory view for illustrating a region Y in FIG. 2A.

As illustrated in FIGS. 2A and 2B, a plurality of recessed portions 42 are present on the surface of the land 41. FIG. 2B is an enlarged explanatory view for illustrating a region Y illustrated in FIG. 2A.

A buffer body 24 is located in an inner portion of the recessed portions 42. The buffer body 24 contains resin. Examples of the resin include, but are not limited to, resins such as epoxy resin, bismaleimide-triazine resin, polyimide resin, polyphenylene ether resin, cycloolefin resin, and liquid crystal polymer. These resins may be used alone or in a combination of two or more. In particular, these resins may be the same resin as the resin forming the second insulation layer 22b.

Insulating particles 24' may be included in the buffer body 24. Examples of such insulating particles 24' are not limited, and include inorganic insulating fillers such as silica, alumina, barium sulfate, talc, clay, glass, calcium carbonate, and titanium oxide. The insulating particles 24' may be, for example, the same as the insulating particles 23 included in the second insulation layer 22b.

The via-hole electrical conductor 5 is formed of a first metal layer 5a, a second metal layer 5b, and a third metal layer 5c. The first metal layer 5a is located on an inner peripheral surface of the via hole included in the second insulation layer 22b and on a peripheral edge portion of the via hole. The first metal layer 5a is formed of, for example, nichrome and has a thickness from 1 nm to 100 nm. The second metal layer 5b is located so as to cover the surface of the first metal layer 5a. The second metal layer 5b is formed of, for example, copper and has a thickness from 100 nm to 1000 nm. The inside of the via hole is filled with the third metal layer 5c so as to cover a surface of the second metal layer 5b. The third metal layer 5c is formed of, for example, copper.

Even when there is a relatively large difference between the linear expansion coefficient and the Young's modulus of the conductor (in particular, the fourth metal layer 41d) included in the land 41 and the linear expansion coefficient and the Young's modulus of the conductor (in particular, the first metal layer 5a) included in the via-hole electrical conductor 5, the presence of the buffer body 24 on an upper surface of the land 41 can alleviate, for example, a stress generated during thermal expansion and contraction. As a result, the connection reliability between the via-hole electrical conductor 5 and the land 41 is improved. The buffer body 24 is present only in the recessed portion formed on the upper surface of the land 41, and does not affect the electrical reliability between the land 41 and the via-hole electrical conductor 5.

In order to further improve the connection reliability without reducing the electrical reliability between the via-hole electrical conductor 5 and the land 41, a ratio of a surface area occupied by the buffer body 24 to a surface area of the bottom portion of the via hole in plan view may be, for example, from 1% to 20%. The surface area occupied by the buffer body 24 may be determined from an electron micrograph. Specifically, it may be determined by the following procedure.

After the via hole is formed in the second insulation layer 22*b*, the surface of the land 41 serving as the bottom portion of the via hole is observed with a field emission scanning electron microscope (FE-SEM), and a reflected electron micrograph of the surface of the land 41 is captured. The captured reflected electron micrograph is binarized by image processing software "Image J". The buffer body 24 portion appears black, and thus a portion having a degree of blackness of 70% or more is recognized as black, and the surface area occupied by the buffer body 24 is obtained. From this surface area and the surface area of the bottom portion of the via hole, a ratio of the surface area occupied by the buffer body 24 to the contact surface area between the land 41 and the via-hole electrical conductor 5 may be calculated.

A silane coupling agent is present in at least a part of a non-contact portion with the via-hole electrical conductor 5 in the land 41. Specifically, the non-contact portion with the via-hole electrical conductor 5 is the side surface of the land 41, the peripheral edge of the via-hole on the upper surface of the land 41, and the inner surface of the recessed portion. The adhesiveness between the land 41 made of metal and the second insulation layer 22*b* made of resin may be poor. When the silane coupling agent is present between the land 41 and the second insulation layer 22*b*, the adhesiveness between the land 41 and the second insulation layer 22*b* can be further improved. The silane coupling agent is a compound including, in the molecule, a functional group that reacts with an inorganic material and a functional group that reacts with an organic material. Thus, the metal (land 41) which is an inorganic material and the resin (second insulation layer 22*b*) which is an organic material are bonded to each other via the silane coupling agent, and the adhesiveness between the land 41 and the second insulation layer 22*b* is further improved. The presence of such a silane coupling agent can be confirmed, for example, by analyzing the above functional group structure using Fourier transform infrared spectroscopy (FTIR) or by performing mass analysis using time-of-flight secondary ion mass spectrometry (TOF-SIMS).

In the wiring board 1 according to the embodiment, the method of forming the land 41 and the via-hole electrical conductor 5 is not limited, and the land 41 and the via-hole electrical conductor 5 are formed by, for example, the following method.

The first metal layer 41*a* is formed on the surface of the first insulation layer 22*a*. The first insulation layer 22*a* is as described above, and detailed description thereof will be omitted. The first metal layer 41*a* is made of nichrome by, for example, sputtering. The thickness of the first metal layer 41*a* is as described above. Next, the second metal layer 41*b* is formed so as to cover the surface of the first metal layer 41*a*. The second metal layer 41*b* is made of copper by, for example, sputtering. The thickness of the second metal layer 41*b* is as described above.

Next, in order to form the third metal layer 41*c*, a plating resist including openings is formed on the surface of the second metal layer 41*b*. Thereafter, the second metal layer 41*b* is subjected to an electrolytic copper plating process and copper is deposited in the openings. Next, the plating resist is peeled off, and the second metal layer 41*b* in a portion covered with the plating resist is removed by, for example, an acid (a mixed solution of sulfuric acid and hydrogen peroxide water). Next, the first metal layer 41*a* is removed by, for example, an acid (such as a mixed solution of hydrochloric acid and sulfuric acid). At this time, the surface of the copper deposited by the electrolytic copper plating is also eroded by the acid to form depressions each having a diameter and a depth, for example, from about 10 nm to about 200 nm.

Next, the surface of the copper on which the depressions are formed is subjected to a soft etching process. The soft etching is performed using, for example, a sulfuric acid-hydrogen peroxide-based chemical solution. By performing the soft etching process, the diameter and the depth of the depression are set to, for example, from about 10 nm to about 100 nm. The soft etching process is performed in order to adjust the size of the buffer body 24 which is finally formed in the recessed portions 42. When the soft etching process is performed for a long time, the copper deposited by the electrolytic copper plating is also eroded in the width direction. Thus, when the surface of the copper is eroded and the diameter and the depth of the depression are within the above-described range, the soft etching process is terminated. In this way, a layer which finally becomes the third metal layer 41*c* is formed.

Next, the surfaces of the layered metal layers (copper) are subjected to a substitution tin plating process. The surface of the copper is substituted with tin by the substitution tin plating. At this time, the copper is substituted with tin, and tin is deposited even in the depressions formed by the soft etching process. Thereafter, the surface of the tin is treated with nitric acid to remove the part of the tin in the depressions, thereby forming the recessed portions 42 in which tin is deposited on an inner wall surface. Next, the silane coupling agent is adhered to the surface of the tin. For example, the recessed portions 42 such as those described above each have a diameter and a depth, for example, from about 10 nm to about 500 nm. When the above-described soft etching process is not performed, for example, the depth of the recessed portions 42 may become excessively deep.

Next, the second insulation layer 22*b* is formed so as to cover the first insulation layer 22*a* and the third metal layer 41*c* with tin deposited on the surface thereof. The second insulation layer 22*b* is as described above, and detailed description thereof will be omitted. At this time, some of the resin forming the second insulation layer 22*b* is also embedded in the recessed portions 42 formed in the surfaces of the layered metal layers. When the insulating particles 23 are contained in the resin constituting the second insulation layer 22*b*, some of the insulating particles 23 are also embedded in the recessed portions 42. In this way, the buffer body 24 (including the insulating particles 24' if necessary) is formed in the recessed portions 42.

Subsequently, via holes are formed in the second insulation layer 22*b*. The via holes are formed at positions where a part of the layered metal layers serves as a bottom portion by, for example, the above-described laser machining process. Thereafter, the first metal layer 5*a* is formed so as to cover the second insulation layer 22*b* and the via holes. The first metal layer 5*a* is made of nichrome by, for example, sputtering. The thickness of the first metal layer 5*a* is as described above. Next, the second metal layer 5*b* is formed so as to cover the surface of the first metal layer 5*a*. The second metal layer 5*b* is made of copper by, for example, sputtering. The thickness of the second metal layer 5*b* is as described above. Due to heat generated during the sputtering, an alloy of tin and copper is formed from tin formed on the surface of the layered metal layers and copper contained in the third metal layer 41*c*. Thus, the land 41 is formed. In the first metal layer 5*a*, although nichrome is described as an example, in addition to this, transition metals of Group 4, Group 5, or Group 6 of the periodic table such as titanium, chromium, nickel, tantalum, molybdenum, tungsten, and palladium may be formed using sputtering or vapor deposition other than sputtering.

Next, in order to form the third metal layer 5c in the via hole, a plating resist is formed on the surface of the second metal layer 5b other than the via hole and the peripheral edge portion of the via hole. Thereafter, the second metal layer 5b is subjected to an electrolytic copper plating process and copper is deposited on a plating resist unprocessed portion. Next, the plating resist is peeled off, and the first metal layer 5a and the second metal layer 5b in the portion covered with the plating resist are removed by, for example, the above-described acid. In this way, the via-hole electrical conductor 5 connected to the land 41 is formed.

When an insulation layer is further layered as the build-up layer, the same or a similar procedure may be repeated from the above-described soft etching process. That is, the procedure after the soft etching process for adjusting the diameter and the depth of the depression formed in the surface of the via-hole electrical conductors 5 (third metal layer 5c) may be repeated.

Needless to say, the core layer 21 may be regarded as the "first insulation layer" and the land 41 may be formed on the surface of the core layer 21 by the above-described procedure, and the first insulation layer 22a may be regarded as the "second insulation layer" and the via-hole electrical conductors 5 may be formed by the above-described procedure.

In this way, the wiring board 1 can be obtained in which the via-hole electrical conductor 5 is connected to the surface of the land 41 and the buffer body 24 located on the surface of the land 41. A part of the via-hole electrical conductor 5 is connected to the buffer body 24, and thus the connection reliability between the via-hole electrical conductor and the land can be improved without affecting the electrical reliability between the via-hole electrical conductor and the land.

Figure 3:
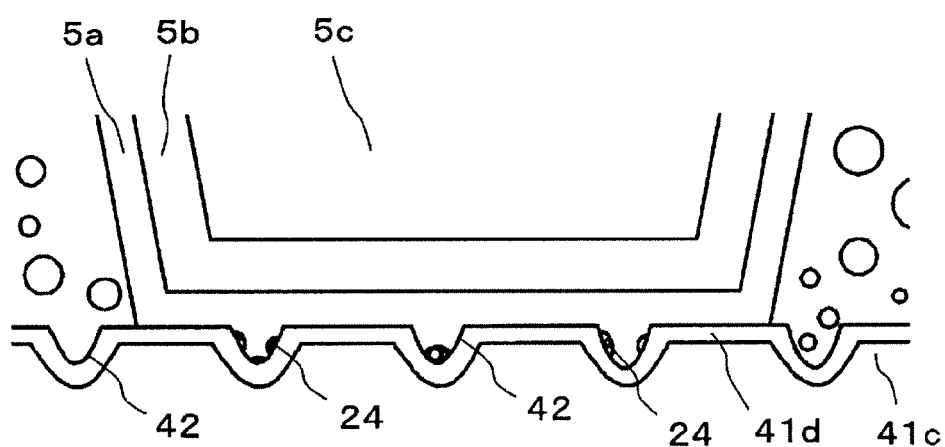
FIG. 3 is an enlarged explanatory view for illustrating another embodiment of the region Y in FIG. 2A.

The wiring board of the present disclosure is not limited to the above-described embodiments. FIG. 2B described above illustrates an embodiment in which the buffer body 24 is located in the entirety of the recessed portions 42. However, as illustrated in FIG. 3, the buffer body 24 may be located only on a part of an inner wall of the recessed portions 42. In this case, the contact surface area between the first metal layer 5a of the via-hole electrical conductor 5 and the fourth metal layer 41d in the recessed portions 42 is increased. Thus, the adhesiveness between the land 41 and the first metal layer 5a (via-hole electrical conductor 5) can be further improved. When the buffer body 24 contains air or moisture, there is an advantage in that the air or moisture can be removed more easily as compared with when the buffer body 24 is located in the entirety of the recessed portions 42.

A metal oxide film 25 may be located on at least a part of the surface of the buffer body 24. Examples of the metal oxide film include, for example, a nickel oxide film. Nickel oxide has a smaller Young's modulus than, for example, nickel used as the first metal layer 5 a. Thus, when the metal oxide film 25 is located between the buffer body 24 and the first metal layer 5 a, there is an advantage in that a stress-relieving effect is improved as compared with when the buffer body 24 and the first metal layer 5 a are in direct contact with each other.

REFERENCE SIGNS

1 Wiring board
2 Insulation layer
21 Core layer
22 Build-up layer
22 a First insulation layer
22 b Second insulation layer
23 Insulating particle
24 Buffer body
25 Metal Oxide film
24' Insulating particle
3 Through-hole conductor
4 Wiring conductor layer
41 Land
41 a First metal layer
41 b Second metal layer
41 c Third metal layer
41 d Fourth metal layer
42 Recessed portion
5 Via-hole electrical conductor
5 a First metal layer
5 b Second metal layer
5 c Third metal layer:
S1 First surface
S2 Second surface

The invention claimed is:

1. A wiring board comprising:
a first insulation layer comprising a first surface;
a land located on the first insulation layer and comprising a second surface;
a second insulation layer located at the first surface of the first insulation layer and comprising a via hole extending over the second surface of the land; and
a via-hole electrical conductor located in the via hole, wherein
the land comprises a plurality of recessed portions on the second surface, and
a buffer body located entirely within a respective recessed portion selected from the plurality of recessed portions, wherein the buffer body is formed from a resin and is located between the via-hole electrical conductor and the second surface of the land, and
the via-hole electrical conductor is in contact with the second surface of the land and the buffer body.

2. The wiring board according to claim 1, wherein the buffer body is located only on a part of an inner wall of the at least one recessed portion.

3. The wiring board according to claim 1, wherein the resin is a same resin as the second insulation layer.

4. The wiring board according to claim 1, wherein the buffer body further contains insulating particles.

5. The wiring board according to claim 1, wherein a metal oxide film is located on at least a part of a surface of the buffer body.

6. The wiring board according to claim 1, wherein the land comprises an alloy layer of tin and copper between the land and the second insulation layer.

7. The wiring board according to claim 1, wherein a silane coupling agent is present in at least a part of a non-contact portion with the via-hole electrical conductor on a surface of the land.

8. The wiring board according to claim 1, wherein a ratio of a surface area occupied by the buffer body to a contact surface area between the land and the via-hole electrical conductor in plan view is from 1% to 20%.

* * * * *